United States Patent
Jung et al.

(10) Patent No.: US 8,680,513 B2
(45) Date of Patent: Mar. 25, 2014

(54) ORGANIC LIGHT EMITTING DIODE DISPLAY

(75) Inventors: Woo-Suk Jung, Yongin (KR); Eun-Ah Kim, Yongin (KR); Soon-Ryong Park, Yongin (KR); Hee-Seong Jeong, Yongin (KR); Hee-Chul Jeon, Yongin (KR); Chul-Woo Jeong, Yongin (KR); Joo-Hwa Lee, Yongin (KR); Noh-Min Kwak, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 596 days.

(21) Appl. No.: 12/650,999

(22) Filed: Dec. 31, 2009

(65) Prior Publication Data

US 2010/0171106 A1 Jul. 8, 2010

(30) Foreign Application Priority Data

Jan. 7, 2009 (KR) ........................ 10-2009-0001166

(51) Int. Cl.
*H01L 29/08* (2006.01)

(52) U.S. Cl.
USPC ............................... 257/40; 438/29; 428/690

(58) Field of Classification Search
USPC ................................. 257/40; 428/690; 438/29
See application file for complete search history.

(56) References Cited

U.S. PATENT DOCUMENTS

| 2005/0174045 | A1 | 8/2005 | Lee et al. |
| 2007/0108899 | A1 | 5/2007 | Jung et al. |
| 2007/0188088 | A1 | 8/2007 | Suzuki et al. |
| 2007/0194322 | A1 | 8/2007 | Sung et al. |
| 2008/0042146 | A1* | 2/2008 | Cok et al. .......................... 257/79 |
| 2008/0048557 | A1* | 2/2008 | Birnstock et al. ............. 313/504 |
| 2009/0039773 | A1 | 2/2009 | Jun et al. |
| 2009/0068453 | A1* | 3/2009 | Chung .......................... 428/337 |
| 2009/0115688 | A1 | 5/2009 | Adachi et al. |

FOREIGN PATENT DOCUMENTS

| KR | 10-2004-0049141 | 6/2004 |
| KR | 10-2005-0030296 | 3/2005 |
| KR | 10-2007-0055908 | 5/2007 |
| KR | 10-0793546 | 1/2008 |
| KR | 10-0838090 | 6/2008 |

OTHER PUBLICATIONS

U.S. Appl. No. 12/651,011, filed Dec. 31, 2009, Woo-Suk Jung et al., Samsung Mobile Display Co., Ltd.
U.S. Office action dated Jan. 18, 2012, for cross reference U.S. Appl. No. 12/651,011, (15 pages).
U.S. Office action dated Apr. 26, 2012, for cross reference U.S. Appl. No. 12/651,011, (17 pages).
U.S. Office action dated Jul. 30, 2013, for cross reference U.S. Appl. No. 12/651,011, (17 pages).

* cited by examiner

*Primary Examiner* — Shaun Campbell
(74) *Attorney, Agent, or Firm* — Christie, Parker & Hale, LLP

(57) ABSTRACT

An organic light emitting diode display including: a substrate; a plurality of pixel electrodes formed on the substrate; a pixel defining layer formed on the substrate, having openings exposing the pixel electrodes; a plurality of spacers disposed on the pixel defining layer; organic emission layers formed on the pixel electrodes; a common electrode formed on the organic emission layers; and a capping layer formed on the common electrode, to cover the organic emission layers.

17 Claims, 4 Drawing Sheets

ORGANIC LIGHT EMITTING DIODE DISPLAY

CROSS-REFERENCE TO RELATED APPLICATION

This application claims the benefit of Korean Patent Application No. 10-2009-0001166, filed in the Korean Intellectual Property Office on Jan. 7, 2009, the disclosure of which is incorporated herein, by reference.

BACKGROUND OF THE INVENTION

1. Field of the Invention

Aspects of the present invention relate to an organic light emitting diode (OLED) display having improved visibility and image quality.

2. Description of the Related Art

An organic light emitting diode display includes a plurality of organic light emitting diodes that include hole injection electrodes, organic emission layers, and electron injection electrodes. Light is produced when excitons, generated by the combination of holes and electrons in the organic emission layer, transition from an excited state to a grounded state. The light is then used to from an image.

An organic light emitting diode display has self-emitting characteristics and therefore, does not require an additional light source. Therefore, an organic light emitting diode display can be thinner and lighter than a liquid crystal display, which includes such an additional light source. Further, since organic light emitting diode displays have a low power consumption, a high luminance, and a high reaction speed, they have attracted considerable attention as next-generation displays for portable electronic apparatuses.

In general, the hole injection electrodes, the electron injection electrodes, and various other metal wires disposed in an organic light emitting diode display reflect ambient light. When an organic light emitting diode display is used in a bright environment, contrast and black levels are reduced, due to the ambient light reflection, resulting in reduced image visibility.

Further, since an organic light emitting diode display includes a plurality of thin films and substrates, a concentric circle pattern (Newton's ring) may be generated, due to the films and substrates having different refractive indexes. The Newton's ring reduces the quality of an image displayed by an organic light emitting diode display.

The above information is disclosed only to enhance the understanding of the background of the invention, and therefore, it may contain information that does not constitute prior art.

SUMMARY OF THE INVENTION

Aspects of the present invention provide an organic light emitting diode display having improved visibility and image quality.

An exemplary embodiment of the present invention provides an organic light emitting diode display that includes: a substrate member; a plurality of pixel electrodes formed on the substrate member; a pixel defining layer that has a plurality of openings exposing the plurality of pixel electrodes, formed on the substrate member; a plurality of spacers that protrude upward from the pixel defining layer; an organic emission layer formed on the pixel electrode; a common electrode formed on the organic emission layer; and a capping layer formed on the common electrode, to cover the organic emission layer.

According to aspects of the present invention, the capping layer may be a crystallized organic layer or a crystallized inorganic layer.

According to aspects of the present invention, the capping layer may be an organic layer that contains at least one of 4,4'-bis[N-(1-naphthyl)-N-phenylamino]biphenyl (a-NPD), N,N'-diphenyl-N,N'-bis(1-naphthyl)-(1,1'-biphenyl)-4,4'-diamine (NPB), N,N'-bis(3-methylphenyl)-N,N'-diphenyl-[1,1-biphenyl]-4,4'diamine (TPD), 4,4,4-tris(3-methyphenylamino)triphenylamine (m-MTDATA), tris(8-hydroxyquinoline) aluminum ($Alq_3$), LiF, 2-(4-biphenylyl)-5-(4-tert-butylphenyl)-1,3,4-oxadiazole (PBD), zirconium oxide, and copper phthalocyanine (CuPc).

According to aspects of the present invention, the capping layer may be an inorganic layer that contains silicon (Si).

According to aspects of the present invention, the capping layer may be crystallized through a heat treatment process.

According to aspects of the present invention, the capping layer may have a higher surface roughness than a conventional non-crystallized capping layer.

According to aspects of the present invention, the capping layer has a haze value of about 5% to about 30%.

According to aspects of the present invention, the spacers may have at least one portion that is shaped as a truncated pyramid, a prism, a truncated circular cone, a cylinder, a hemisphere, or a semi-oblate sphere. The organic light emitting diode display may further include a sealing member disposed opposite to the substrate member, with the spacers interposed therebetween. The spacer may maintain a space between the substrate member and the sealing member.

According to aspects of the present invention, the spacers and the pixel defining layer may be integrally formed, using the same material and the same process.

According to aspects of the present invention, the organic light emitting diode display further includes conductive layers disposed below the spacers. The spacers may disperse light reflected by the conductive layers.

According to aspects of the present invention, provided is an organic light emitting diode display having improved visibility and image quality, due to the suppression of ambient light reflection and the suppression of the formation of a Newton's ring. Further, the organic light emitting diode display can have a reduced thickness.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
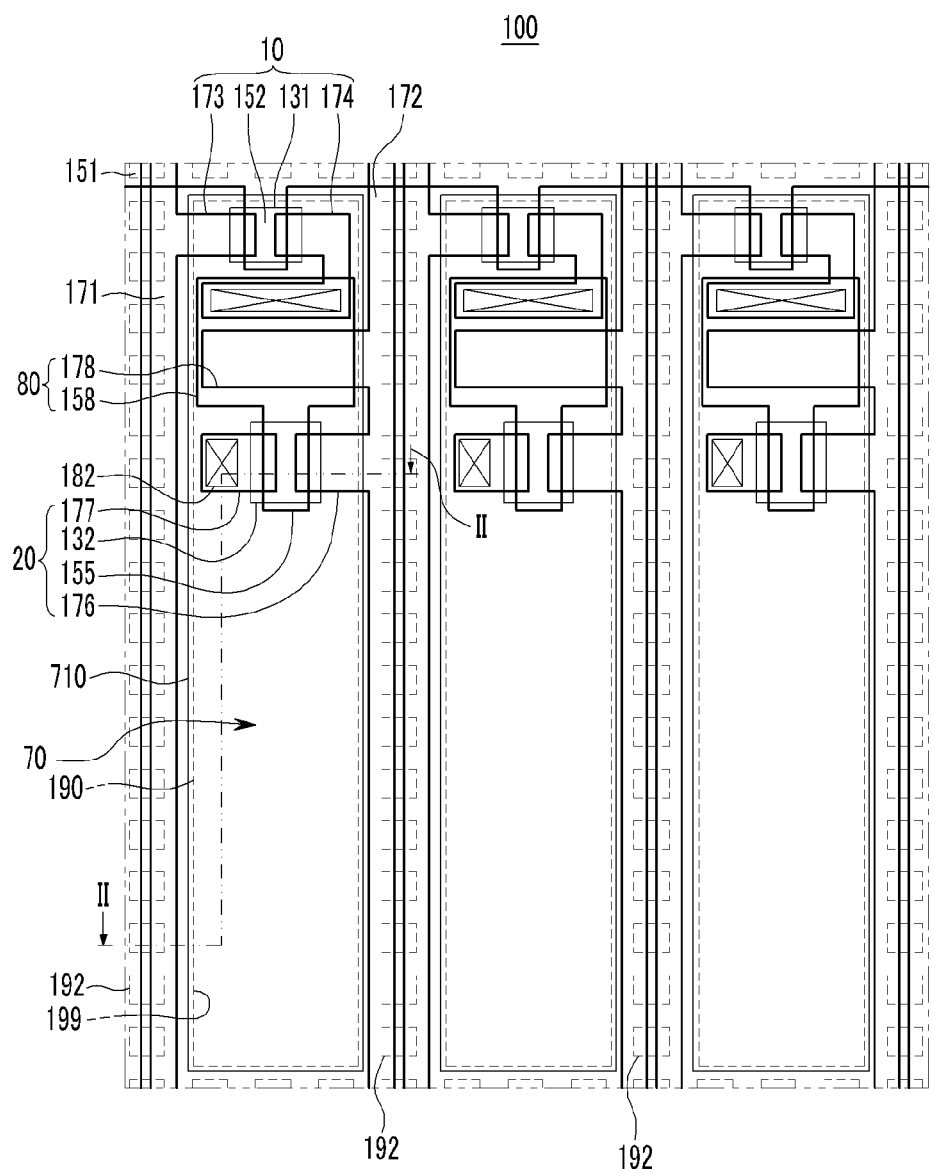
FIG. 1 is a plan view of an organic light emitting display device, according to an exemplary embodiment of the present invention.

Reference will now be made in detail to the exemplary embodiments of the present invention, examples of which are illustrated in the accompanying drawings, wherein like reference numerals refer to the like elements throughout. The embodiments are described below, in order to explain the aspects of the present invention, by referring to the figures.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. It will be understood that when a first element is referred to as being formed or disposed "on" another element, the first can be directly on the other element, or intervening elements may also be present. In contrast, when an element is referred to as being formed or disposed "directly on" another element, there are no intervening elements present.

Further, in the accompanying drawings, although an active matrix (AM) organic light emitting diode display, having a 2Tr-1 Cap structure that is provided with two thin film transistors (TFTs) and one storage capacitor in one pixel, is shown, exemplary embodiments of the present invention are not limited thereto. Accordingly, the organic light emitting diode display may be provided with three or more thin film transistors and two or more storage capacitors, in each pixel, and may be configured to have various structures and/or additional wires. Herein, the pixel represents a minimum unit of an image, and the organic light emitting diode display displays the image using a plurality of the pixels.

Figure 2:
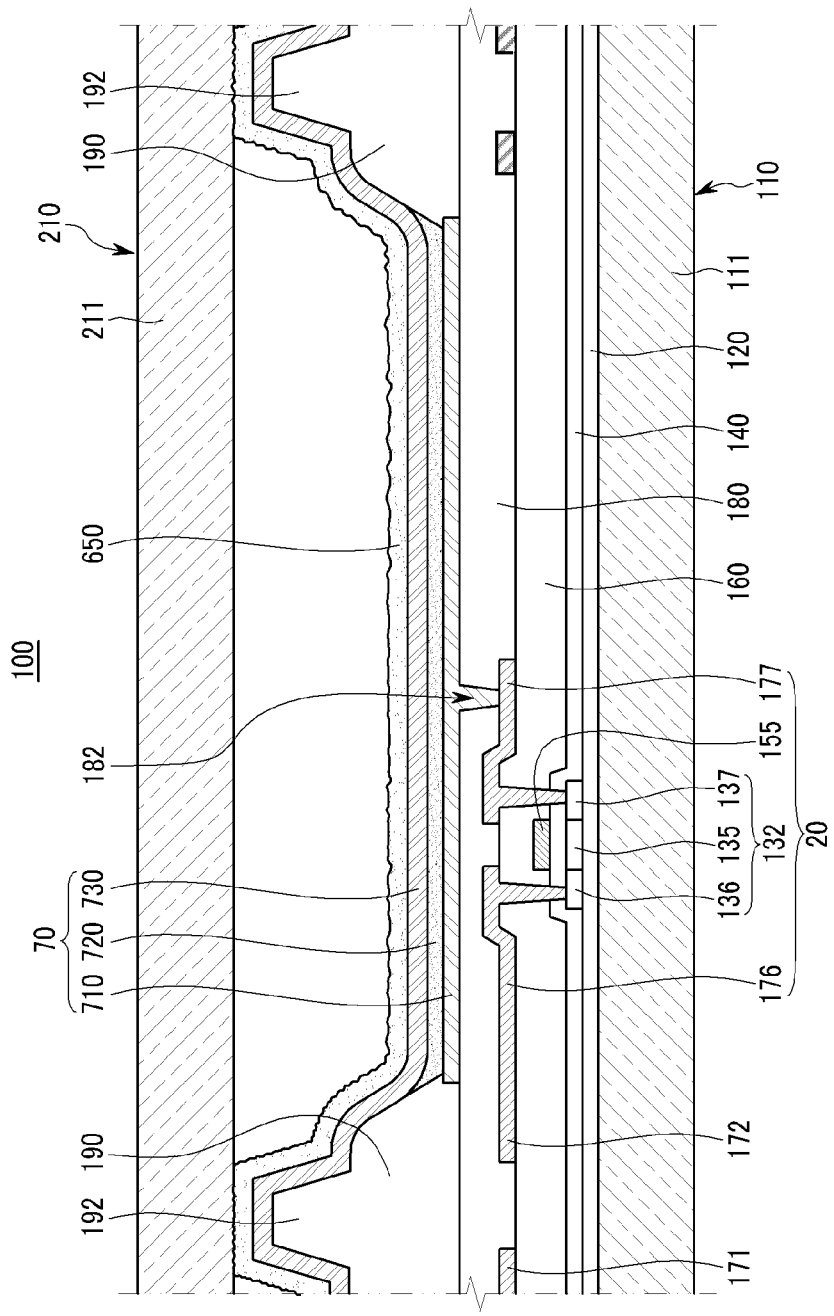
FIG. 2 is a cross-sectional view taken along the line II-II of FIG. 1.

FIGS. 1 and 2 illustrate an organic light emitting diode display 100, according to an exemplary embodiment of the present invention. As shown in FIGS. 1 and 2, the organic light emitting diode display 100 includes a display substrate 110 and a sealing member 210. FIG. 1 is a layout view illustrating the structure of a pixel on the display substrate 110. FIG. 2 is a cross-sectional view illustrating both the display substrate 110 and the sealing member 210, taken along the line II-II of FIG. 1.

The display substrate 110 includes a switching thin film transistor 10, a driving thin film transistor 20, a storage capacitor 80, and an organic light emitting diode (OLED) 70, which are formed on a first substrate member 111 of the display substrate 110, in each pixel. The display substrate 110 includes a gate line 151 that extends in one direction, a data line 171 that crosses and is insulated from the gate line 151, and a common power supply line 172. Herein, a boundary of one pixel may be defined by the gate line 151, the data line 171, and the common power supply line 172, but the present invention is not limited thereto.

The OLED 70 includes a pixel electrode 710, an organic emission layer 720 formed on the pixel electrode 710, and a common electrode 730 formed on the organic emission layer 720. Herein, the pixel electrode 710 is referred to as a positive (+) electrode (hole injection electrode) and the common electrode 730 is referred to as a negative (−) electrode (electron injection electrode). However, the present invention is not limited thereto. Therefore, the pixel electrode 710 may be a negative electrode, and the common electrode 730 may be a positive electrode, according to a driving method of the organic light emitting diode display 100. Holes and electrodes are injected into the organic emission layer 720, from the pixel electrode 710 and the common electrode 730. Light is produced when excitons, which are generated by the combination of the holes and electrons, in the organic emission layer, transition from an excited state to a grounded state.

In the organic light emitting element 70, light from the organic emission layer 720 is radiated away from the pixel electrode 710, that is, toward the common electrode 730, to display images. That is, the organic light emitting diode display 100 is a top emission-type.

The storage capacitor 80 includes a first storage plate 158, a second storage plate 178, and a gate insulating layer 140 interposed therebetween. The gate insulating layer 140 can be referred to as a dielectric material. Storage capacity is determined by the amount of electric charge stored in the storage capacitor 80 and a voltage difference between the storage plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 serves as a switching element that selects a desired light emitting pixel. The switching gate electrode 152 is connected to the gate line 151. The switching source electrode 173 is connected to the data line 171. The switching drain electrode 174 is disposed opposite to the switching source electrode 173 and is connected to the first storage plate 158.

The driving thin film transistor 20 applies a driving voltage to the OLED 70, which is applied to the organic emission layer 720, to produce light. The driving voltage is applied according to the control of the switching thin film transistor 10. The driving gate electrode 155 is connected to the first storage plate 158. The driving source electrode 176 and the second storage plate 178 are connected to the common power supply line 172. The driving drain electrode 177 is connected to the pixel electrode 710, through a contact hole 182.

The switching thin film transistor 10 is actuated by a gate voltage applied to the gate line 151, so as to transmit a data voltage from the data line 171 to the driving thin film transistor 20. A voltage, corresponding to a difference between a common voltage, which is applied to the driving thin film transistor 20 from the common power supply line 172, and a data voltage, which is transmitted from the switching thin film transistor 10, is stored in the storage capacitor 80. A current corresponding to the voltage stored in the storage capacitor 80 flows to the organic light emitting element 70, through the driving thin film transistor 20, such that the organic light emitting element 70 emits light.

The display substrate 110 includes a pixel defining layer 190, spacers 192, and a capping layer 650. The pixel defining layer 190 has an opening 199 exposing the pixel electrode 710, and defines an emission region and a non-emission region of the organic light emitting element 70. The pixel electrode 710, the organic emission layer 720, and the common electrode 730 are sequentially laminated in the opening 199, such that the organic emission layer 720 emits light. That is, where the pixel defining layer 190 is formed substantially forms the non-emission region, and the opening 199 substantially forms the emission region.

Each spacer 192 is formed on the pixel defining layer 190. That is, each spacer 192 is formed in the non-emission region. The spacers 192 separate the display substrate 110 and the sealing member 210. Further, the spacers 192 also suppress ambient light reflection, by dispersing ambient light reflected by a conductive layer disposed below the spacers 192. Herein, the conductive layer may include the gate line 151, the data line 171, and the common power supply line 172.

The pixel defining layer 190 and the spacer s192 may be integrally formed, through a photography process or a photolithography process, by using a photosensitive material. That is, the pixel defining layer 190 and the spacers 192 may be formed by using a half-tone exposure process. However, the exemplary embodiment of the present invention is not limited thereto. Therefore, the pixel defining layer 190 and the spacers 192 may be formed sequentially, or separately, and may be made of different materials.

Each spacer 192 may have portions that are shaped as a truncated pyramid, a prism, a truncated circular cone, a cylinder, a hemisphere, or a semi-oblate sphere. In addition, the spacers 192 may be uniformly or non-uniformly distributed on the pixel defining layer 190.

The pixel electrode 710 and the opening 199 of the pixel defining layer 190 are included in each pixel. Therefore, the organic light emitting diode display 100 includes a plurality of pixel electrodes 710 and a plurality of the openings 199. The spacers 192 also are included in each pixel. As the number of the spacers 192 increases, a light dispersion effect can be increased.

The capping layer 650 is formed on the common electrode 730, so as to cover the organic light emitting element 70. The capping layer 650 is formed of either a crystallized organic layer or a crystallized inorganic layer. More specifically, the capping layer 650 can be made by crystallizing an organic layer including at least one of 4,4'-bis[N-(1-naphthyl)-N-phenylamino]biphenyl (a-NPD), N,N'-diphenyl-N,N'-bis(1-naphthyl)-(1,1'-biphenyl)-4,4'-diamine (NPB), N,N'-bis(3-methylphenyl)-N,N'-diphenyl-[1,1-biphenyl]-4,4'diamine (TPD), 4,4,4-tris(3-methylphenylamino)triphenylamine (m-MTDATA), tris(8-hydroxyquinoline) aluminum ($Alq_3$), LiF, 2-(4-biphenylyl)-5-(4-tert-butylphenyl)-1,3,4-oxadiazole (PBD), zirconium oxide, and copper phthalocyanine (CuPc). In the alternative, the capping layer 650 can be made by crystallizing an inorganic layer containing Si, such as silicon nitride (SiNx), silicon oxide (SiOx), and silicon oxynitride (SiOxNy).

The capping layer 650 is crystallized through a heat treatment process. Further, the capping layer 650 has a higher surface roughness than a conventional non-crystallized capping layer. The capping layer 650 has a haze value of about 5% to about 30%.

The capping layer 650 helps to efficiently emit light generated by the organic light emitting element 70 and protects the organic light emitting element 70. The capping layer 650 disperses ambient light reflected by the pixel electrode 710, the common electrode 720, and/or other conductive layers. Accordingly, the capping layer 650 and the spacers 192 improve the visibility of the organic light emitting diode display, by suppressing the ambient light reflection. The capping layer 650 can also prevent a Newton's ring from being generated in the organic light emitting diode display 100.

A Newton's ring may be generated by the various layers included in the organic light emitting diode display 100. For example, a Newton's ring may be generated between the display substrate 110 and the sealing member 210. A Newton's ring is generated by interference caused by a phase difference, which is generated when light passes among layers having different refractive indexes and/or thicknesses. A generation frequency of the Newton's ring is influenced by the refractive indexes of the layers, the thicknesses of the layers, and the phase differences and the intensity of light passing there through. The distance at which the layers are separated should be properly controlled, in order to suppress the Newton's ring. That is, there should be a sufficient separation between the display substrate 110 and the sealing member 210, in order to suppress the generation of the Newton's ring by the display substrate 110 and the sealing member 210.

The capping layer 650 suppresses the generation of the Newton's ring, by dispersing the reflected ambient light. That is, the capping layer 650 serves as an anti-Newton's ring film. Accordingly, a gap between the display substrate 110 and the sealing member 210 can be minimized. Therefore, the thickness of the organic light emitting diode display 100 can be reduced.

The sealing member 210 is disposed opposite to the display substrate 110, to cover the thin film transistors 10 and 20, the storage capacitor 80, and the organic light emitting element 70. The sealing member 210 includes a second substrate member 211. In addition, although not shown, the display substrate 110 and the sealing member 210 are sealed together by a sealant disposed on edges of the display substrate 110 and the sealing member 210.

The organic light emitting diode display 100 can have excellent visibility, by suppressing the reflection of ambient light. The organic light emitting diode display 100 can minimize the loss of the light generated by the organic light emitting element 70.

The organic light emitting diode display 100 may omit a polarizing member that is generally used for suppressing the reflection of ambient light. Therefore, it is possible to improve the luminous efficiency of the organic light emitting diode display 100, as compared to when a polarizing member is used. That is, it is possible to improve the luminance and lifespan of the organic light emitting diode display 100.

It is possible to suppress a Newton's ring from being generated in the organic light emitting diode display 100. The gap between the display substrate 110 and the sealing member 210 can also be minimized, while suppressing the Newton's ring.

Hereinafter, the lamination sequence of the organic light emitting diode display 100 will be described in detail. Further, the structure of the thin film transistors will now be described. In addition, the difference between the switching thin film transistor 10 and the driving thin film transistor 20 will be briefly described.

First, the first substrate member 111 is formed from an insulating substrate that is made of glass, quartz, ceramic, plastic, or the like. However, the present invention is not limited thereto. Accordingly, the first substrate member 111 may be formed from a metallic substrate that is made of stainless steel, or the like.

A buffer layer 120 is formed on the first substrate member 111. The buffer layer 120 serves to prevent the diffusion impurities and provides a flattened surface. The buffer layer 120 may be made of various materials, for example, a SiNx film, a SiOx film, or a SiOxNy film. However, the buffer layer 120 may be omitted, depending on the composition of the first substrate member 111 and processing conditions thereof.

The driving semiconductor layer 132 is formed on the buffer layer 120. The driving semiconductor layer 132 is generally a polycrystal silicon film. The driving semiconductor layer 132 includes a channel region 135 where no impurity is doped, and source and drain regions 136 and 137 where an impurity is doped, which are disposed on opposing sides of the channel region 135. The impurity may be a P-type ion material impurity, such as boron (B), or $B_2H_6$. Herein, the impurity type depends on the type of thin film transistor.

In the exemplary embodiment of the present invention, a PMOS-type thin film transistor, using the P-type impurity, is used as the driving thin film transistor 20, but the driving thin film transistor is not limited thereto. Therefore, an NMOS-type thin film transistor, or a CMOS-type thin film transistor, may be used as the driving thin film transistor 20.

The driving thin film transistor 20, as shown in FIG. 2, is a polycrystalline thin film transistor, including the polycrystal silicon film. The switching thin film transistor 10 shown in FIG. 1 may be a polycrystalline thin film transistor, or an amorphous thin film transistor, including an amorphous silicon film.

The gate insulating layer 140, which is made of silicon nitride (SiNx) or silicon oxide (SiOx), is formed on the driving semiconductor layer 132. A gate wire, including the driving gate electrode 155, is formed on the gate insulating layer 140. The gate wire further includes the gate line 151, the first storage plate 158, and other wires. In addition, the driving gate electrode 155 is overlapped by at least part of the driving semiconductor layer 132, and in particular, by the channel region 135.

An interlayer insulating layer 160 is formed on the gate insulating layer 140, so as to cover the driving gate electrode 155. The gate insulating layer 140 and the interlayer insulating layer 160 have through-holes that are aligned to expose the source region 136 and the drain region 137 of the driving semiconductor layer 132. The interlayer insulating layer 160 is made of silicon nitride (SiNx) or silicon oxide (SiOx), like the gate insulating layer 140.

Data wires, including the driving source electrode 176 and the driving drain electrode 177, is formed on the interlayer insulating layer 160. The data wires further include the data line 171, the common power supply line 172, the second storage plate 178, and other wires. The driving source electrode 176 and the driving drain electrode 177 are connected to the source region 136 and the drain region 137, through the through-holes of the interlayer insulating layer 160 and the gate insulating layer 140.

The driving thin film transistor 20 includes the driving semiconductor layer 132, the driving gate electrode 155, the driving source electrode 176, and the driving drain electrode 177. The configuration of the driving thin film transistor 20 is not limited to the above-mentioned example, and may be modified in various known configurations.

A planarization layer 180, covering the data wires 172, 176, 177, and 178, is formed on the interlayer insulating layer 160. The planarization layer 180 serves to planarize the data wires, in order to increase luminous efficiency of the organic light emitting elements 70. The planarization layer 180 includes the contact hole 182 exposing the drain electrode 177. The planarization layer 180 may include at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The exemplary embodiment of the present invention is not limited to the above-mentioned configuration. For example, and either one of the planarization layer 180 and the interlayer insulating layer 160 may be omitted, if necessary.

The pixel electrodes 710 of the organic light emitting elements 70 are formed on the planarization layer 180. That is, the pixel electrodes 710 are respectively disposed in each of the pixels. The pixel electrodes 710 are separated from each other. The pixel electrodes 710 are connected to the drain electrodes 177, through the contact holes 182 of the planarization layer 180.

The pixel defining layer 190 is formed on the planarization layer 180. That is, the openings 199 of the pixel defining layer 190 are formed around each pixel. The pixel electrodes 710 are disposed opposite to the openings 199 of the pixel defining layer 190. However, the pixel electrodes 710 are not necessarily disposed only in the openings 199 of the pixel defining layer 190, as the pixel electrodes 710 may be disposed below the pixel defining layer 190, so that the pixel electrodes 710 overlap the pixel defining layer 190. Where the pixel defining layer 190 is formed substantially forms the non-emission region, and where the openings 199 of the pixel defining layer 190 are formed substantially forms the emission regions.

The spacers 192 are formed on the pixel defining layer 190. That is, the spacers 192 are formed in the non-emission region. The spacers 192 serve to maintain the space between the display substrate 110 and the sealing member 210. The spacers 192 also serve to suppress ambient light reflection, by dispersing ambient light reflected by the conductive layer disposed below the spacers 192. Herein, the conductive layer may include the gate line 151, the data line 171, and the common power supply line 172.

The pixel defining layer 190 and the spacers 192 may be made of a polyacrylate resin, a polyimide-based resin, or a silica-based inorganic material. Further, the pixel defining layer 190 and the spacers 192 may be integrally formed, through the photography process or the photolithography process. That is, both the pixel defining layer 190 and the spacers 192 may be formed by a half-tone exposure process. However, the exemplary embodiment of the present invention is not limited thereto. Therefore, the pixel defining layer 190 and the spacers 192 may be formed sequentially, or separately, and may be made of different materials.

The organic emission layer 720 is formed on the pixel electrode 710, and the common electrode 730 is formed on the organic emission layer 720. As such, each organic light emitting element 70 includes the pixel electrode 710, the organic emission layer 720, and the common electrode 730. The organic emission layer 720 is disposed between the pixel electrode 710 and the common electrode 730, in the opening 199 of the pixel defining layer 190. The common electrode 730 is formed on the organic emission layer 720, the pixel defining layer 190, and the spacer 192.

The organic emission layer 720 can be made of a low molecular weight organic material, or a high molecular weight organic material. The organic emission layer 720 may be formed as laminate including at least one of an emission layer, a hole-injection layer (HIL), a hole-transporting layer (HTL), an electron-transporting layer (ETL), and an electron-injection layer (EIL). The hole-injection layer is disposed on the pixel electrode 710, and then the hole-transporting layer, the emission layer, the electron-transporting layer, and the electron-injection layer are laminated in sequence.

In FIG. 2, the organic emission layer 720 is disposed only in the opening 199 of the pixel defining layer 190, but the present invention is not limited thereto. Accordingly, the organic emission layer 720 may be formed on the pixel electrode 190, in the opening 199 of the pixel defining layer 190, and may be disposed between the pixel defining layer 190 and the common electrode 730. More specifically, the hole-injection layer (HIL), the hole-transporting layer (HTL), the electron-transporting layer (ETL), the electron-injection layer (EIL), the organic emission layer 720, the hole-injection layer (HIL), the hole-transporting layer (HTL), the electron-transporting layer (ETL), and the electron-injection layer (EIL) may be formed on the pixel electrode 710 and on the pixel defining layer 190, by using an open mask in a manufacturing process. That is, the organic emission layer 720 may be disposed between the pixel defining layer 190 and the common electrode 730.

The pixel electrodes 710 and the common electrode 730 may be made of a transparent, semi-transparent, or reflective, conductive material. The organic light emitting diode display 100 may be a top emission type, a bottom emission type, or a double surface emission type, according to the compositions of the pixel electrode 710 and the common electrode 730. The organic light emitting diode display 100 is shown as the top emission type. That is, the organic light emitting element 70 emits light toward the sealing member 210, through the capping layer 650, to display images.

Materials such as indium tin oxide (ITO), indium zinc oxide (IZO), zinc oxide (ZnO), or indium oxide ($In_2O_3$) may be used as the transparent conductive material. Materials such as lithium (Li), calcium (Ca), lithium fluoride/calcium (LiF/Ca), lithium fluoride/aluminum (LiF/Al), aluminum (Al), silver (Ag), magnesium (Mg), or gold (Au) may be used as the reflective material or the semi-transparent material.

The capping layer 650 is formed on the common electrode 730, to cover the organic light emitting element 70. The capping layer 650 is made by crystallizing the organic layer containing at least one of a-NPD, NPB, TPD, m-MTDATA, $Alq_3$, LiF, PBD, zirconium oxide, and CuPc, or by crystallizing the inorganic layer containing Si, such as silicon nitride (SiNx), silicon oxide (SiOx), and silicon oxynitride (SiOxNy). The organic layer may cover the emission layer, the hole-injection layer (HIL), the hole-transporting layer (HTL), the electron-transporting layer (ETL), and/or the electron-injection layer (EIL). The inorganic layer containing silicon (Si) may be used to form the semiconductor layer 132.

The capping layer 650 has a high surface roughness. Accordingly, the capping layer 650 can effectively disperse light.

The capping layer 650 facilitates the emission of light from the organic light emitting element 70 and protects the organic light emitting element 70. Further, the capping layer 650 disperses ambient light reflected by the pixel electrode 710, the common electrode 730, and other conductive layers. Accordingly, the capping layer 650 and the spacer 192 improve the visibility of the organic light emitting diode display 100, by suppressing the reflection of ambient light. The capping layer 650 can also effectively prevent the formation of a Newton's ring.

The sealing member 210 is disposed facing the capping layer 650. The second substrate member 211 of the sealing member 210 is made of the transparent material, such as glass, plastic, of the like. Although not shown, a sealant is disposed on edges of the display substrate 110 and the sealing member 210, such that the display substrate 110 and the sealing member 210 are bonded together and sealed.

The organic light emitting diode display 100 has improved visibility. Further, the organic light emitting diode display 100 can maximize the output of light from the organic light emitting element 70. In addition, the gap between the display substrate 110 and the sealing member 210 can be minimized, to reduce the thickness of the organic light emitting diode display 100.

Figure 3:
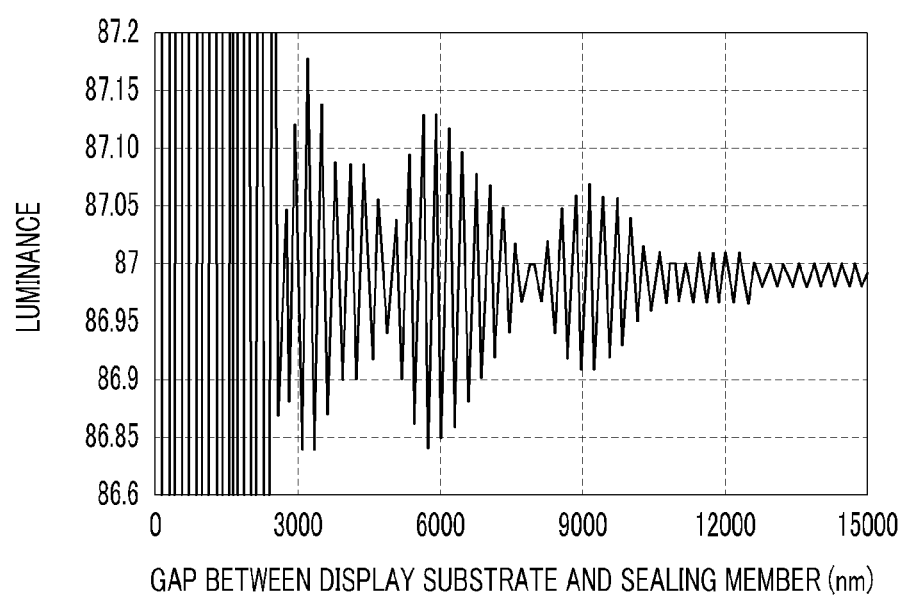
FIGS. 3 and 4 are graphs illustrating experimental results, according to a comparative example and an experimental example.

FIG. 3 is a graph showing luminance variations according to gaps between a display substrate and a sealing member, of a comparative example of an organic light emitting diode display, having a conventional capping layer. As shown in FIG. 3, in the comparative example, the gap between the display substrate 110 and the sealing member 210 was at least approximately 12,000 nm before a Newton's ring was suppressed.

Figure 4:
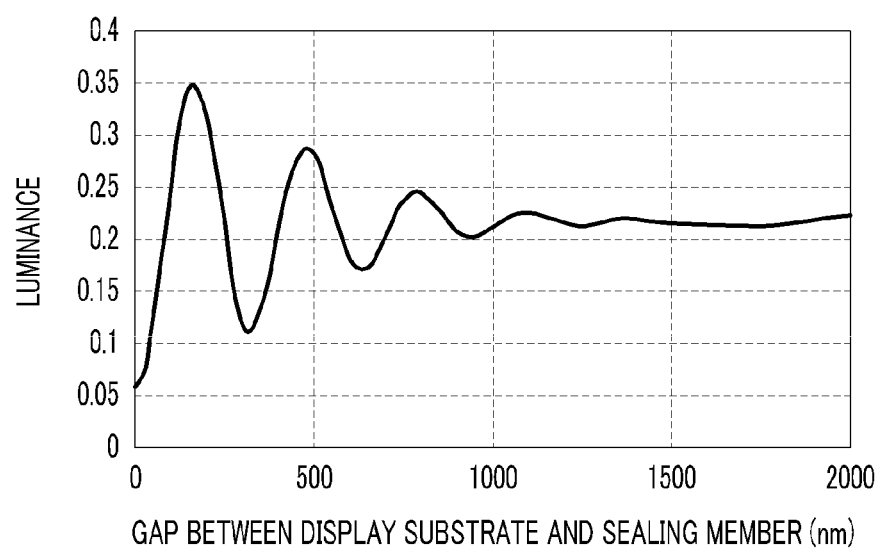

FIG. 4 is a graph showing luminance variations, according to gaps between a display substrate and a sealing member of an organic light emitting diode display, having the capping layer 650. As shown in FIG. 4, the gap between the display substrate and the sealing member was at least 1000 nm, before a Newton's ring was suppressed.

As shown in the above experiments, an organic light emitting diode display having the capping layer 650 minimized the gap between the display substrate 110 and the sealing member 210, while effectively suppressing the formation of a Newton's ring.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light emitting diode display comprising:
a substrate;
pixel electrodes disposed on a surface of the substrate;
a pixel defining layer disposed on the substrate, having openings to expose the pixel electrodes;
spacers disposed on the pixel defining layer, which are shaped to disperse reflected ambient light;
a sealing member disposed on the spacers, facing the substrate;
organic emission layers disposed on the pixel electrodes;
a common electrode disposed on the organic emission layers; and
a capping layer disposed on the common electrode to disperse reflected ambient light,
wherein the spacers maintain a gap between the substrate and the sealing member by holding the capping layer against the sealing member, and
wherein the sealing member contacts the capping layer at regions where the capping layer is between the sealing member and the spacers in a direction substantially perpendicular to the surface of the substrate.

2. The organic light emitting diode display of claim 1, wherein the capping layer comprises a crystallized organic material or a crystallized inorganic material.

3. The organic light emitting diode display of claim 2, wherein the organic material comprises at least one of 4,4'-bis[N-(1-naphthyl)-N-phenylamino]biphenyl (a-NPD), N,N'-diphenyl-N,N'-bis(1-naphthyl)-(1,1'-biphenyl)-4,4'-diamine (NPB), N,N'-bis(3-methylphenyl)-N,N'-diphenyl-[1,1-biphenyl]-4,4'diamine (TPD), 4,4,4-tris(3-methylphenylamino)triphenylamine (m-MTDATA), tris(8-hydroxyquinoline) aluminum ($Alq_3$), LiF, 2-(4-biphenylyl)-5-(4-tert-butylphenyl)-1,3,4-oxadiazole (PBD), zirconium oxide, and copper phthalocyanine (CuPc).

4. The organic light emitting diode display of claim 2, wherein the inorganic material comprises silicon (Si).

5. The organic light emitting diode display of claim 2, wherein the capping layer is crystallized through a heat treatment process.

6. The organic light emitting diode display of claim 2, wherein the capping layer has a higher surface roughness than if the capping layer was not crystallized.

7. The organic light emitting diode display of claim 2, wherein the capping layer has a haze value of about 5% to about 30%.

8. The organic light emitting diode display of claim 1, wherein the spacers each have at least one portion that has a shape selected from a truncated pyramid, a prism, a truncated circular cone, a cylinder, a hemisphere, or a semi-oblate sphere.

9. The organic light emitting diode display of claim 8, wherein the spacer and the pixel defining layer are integrally formed, using the same material and the same process.

10. The organic light emitting diode display of claim 8, further comprising a conductive layers disposed between the spacers and the substrate,
wherein the spacers disperse ambient light reflected by the conductive layers.

11. An organic light emitting diode display comprising:
a substrate;
pixel electrodes disposed on a surface of the substrate;
a pixel defining layer disposed on the substrate, having openings to expose the pixel electrodes;
spacers disposed on the pixel defining layer, which are shaped to disperse reflected ambient light;
organic emission layers disposed on the pixel electrodes;
a common electrode disposed on the organic emission layers and the spacers;
a crystallized capping layer disposed on the common electrode; and
a sealing member disposed on the capping layer,
wherein the spacers maintain a gap between the substrate and the sealing member by holding the capping layer against the sealing member, and
wherein the sealing member contacts the capping layer at regions where the capping layer is between the sealing member and the spacers in a direction substantially perpendicular to the surface of the substrate.

12. The organic light emitting diode display of claim 11, wherein the capping layer comprises at least one material selected from 4,4'-bis[N-(1-naphthyl)-N-phenylamino]biphenyl (a-NPD), N,N'-diphenyl-N,N'-bis(1-naphthyl)-(1,1'-biphenyl)-4,4'-diamine (NPB), N,N'-bis(3-methylphenyl)-N,N'-diphenyl-[1,1-biphenyl]-4,4'diamine (TPD), 4,4,4-tris(3-methylphenylamino)triphenylamine (m-MTDATA), tris(8-hydroxyquinoline) aluminum ($Alq_3$), LiF, 2-(4-biphenylyl)-5-(4-tert-butylphenyl)-1,3,4-oxadiazole (PBD), zirconium oxide, and copper phthalocyanine (CuPc).

13. The organic light emitting diode display of claim 11, wherein the capping layer comprises at least one material selected from silicon nitride ($SiN_x$), silicon oxide ($SiO_x$), and silicon oxynitride ($SiO_xN_y$).

14. The organic light emitting diode display of claim 11, wherein a distance between the sealing member and the substrate is from about 1000 nm to 6000 nm.

15. The organic light emitting diode display of claim 11, wherein the pixel defining layer and the spacers both comprise a polyacrylate resin, a polyimide-based resin, or a silica-based inorganic material.

16. An organic light emitting diode display comprising:
a substrate;
pixel electrodes disposed on a surface of the substrate;
a pixel defining layer disposed on the substrate, having openings to expose the pixel electrodes;
spacers disposed on the pixel defining layer, which are shaped to disperse reflected ambient light;
organic emission layers disposed on the pixel electrodes;
a common electrode disposed on the organic emission layers and the spacers;
a crystallized capping layer disposed on the common electrode; and
a sealing member disposed on the capping layer, wherein
a bottom surface of the sealing member faces, and is parallel to, the surface of the substrate, and
the bottom surface of the sealing member contacts the capping layer at regions where the capping layer is between the sealing member and the spacers in a direction substantially perpendicular to the surface of the substrate.

17. The organic light emitting diode display of claim 1, the capping layer is configured to transmit all wavelengths of light in the visible spectrum.

* * * * *